(12) United States Patent
Matsumoto et al.

(10) Patent No.: US 6,222,781 B1
(45) Date of Patent: Apr. 24, 2001

(54) SEMICONDUCTOR INTEGRATED CIRCUIT DEVICE CAPABLE OF EXTERNALLY APPLYING POWER SUPPLY POTENTIAL TO INTERNAL CIRCUIT WHILE RESTRICTING NOISE

(75) Inventors: Yasuhiro Matsumoto; Hiroshi Akamatsu, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/549,934

(22) Filed: Apr. 14, 2000

(30) Foreign Application Priority Data

Oct. 20, 1999 (JP) .................................................. 11-298326

(51) Int. Cl.[7] .................................................. G11C 16/04
(52) U.S. Cl. .................................. 365/189.09; 365/226
(58) Field of Search .......................... 365/189.09, 201, 365/206, 222, 226

(56) References Cited

U.S. PATENT DOCUMENTS 5,307,315 * 4/1994 Oowaki et al. .................. 365/189.09
5,592,423   1/1997 Tokami ............................. 365/221

FOREIGN PATENT DOCUMENTS 8-106799   4/1996 (JP).

* cited by examiner

*Primary Examiner*—David Nelms
*Assistant Examiner*—David Lam
(74) *Attorney, Agent, or Firm*—McDermott, Will & Emery (57) ABSTRACT

An external terminal and an internal power supply node to an internal circuit are connected via first and second transistors. In a test operation mode, the first and second transisters are turned on and potential is accordingly supplied to the internal circuit from the terminal. In a normal operation mode, a third transistor placed between the terminal and the gate of the first transistor is turned on so that the gate of the first transistor is coupled to the external terminal and the second transistor is turned off. Undershoot to the terminal is not transmitted to the inside since the first transistor is turned off.

10 Claims, 10 Drawing Sheets

SEMICONDUCTOR INTEGRATED CIRCUIT DEVICE CAPABLE OF EXTERNALLY APPLYING POWER SUPPLY POTENTIAL TO INTERNAL CIRCUIT WHILE RESTRICTING NOISE

BACKGROUND OF THE INVENTION

1. Field of the Invention

The present invention relates to a structure of a semiconductor integrated circuit device for supplying power supply potential to an internal circuit in a test mode operation mode. More specifically, the invention relates to a structure of a semiconductor integrated circuit device having a power supply circuit which supplies to an internal circuit an externally applied arbitrary voltage in a test mode.

2. Description of the Background Art

With the enhancement of integration of a semiconductor integrated circuit device such as dynamic random access memory (hereinafter referred to as DRAM), for example, it becomes necessary to ensure the reliability of a scaled down transistor which constitutes the circuit device and to simultaneously satisfy requirements of the specification of an interface for data communication with any external unit of the semiconductor integrated circuit.

In general, the semiconductor integrated circuit device such as semiconductor memory is accordingly provided with a voltage-down power supply circuit which lowers external power supply potential Ext.Vcc to generate internal power supply potential int.Vcc.

Additionally, in the DRAM, the reliability of a memory cell capacitor constituting a memory cell should be assured and further the circuit structure should be implemented with consideration of the noise resistance in data reading as well as low power consumption and guarantee of the read voltage margin. Therefore, in the DRAM, half of the internal power supply potential int.Vcc is supplied to a cell plate which is an electrode opposite to a storage node of the memory cell capacitor and half of the internal power supply potential int.Vcc is also supplied as the precharge potential of a bit line pair.

In addition, a negative potential (substrate potential) is supplied to the substrate for the purposes of improvement in the leakage current characteristic of the transistor, reduction in the parasitic capacitance and the like.

The DRAM thus generally has a plurality of internal power supply circuits placed therein such as voltage-down power supply circuit, cell plate voltage generation circuit, bit line precharge voltage generation circuit, substrate potential generation circuit and the like, even if the externally applied external power supply potential Ext.Vcc is a single potential of 3.3 V, for example.

Those internal power supply circuits are designed to generate a stable potential level even if external power supply potential Ext.Vcc varies so as to ensure the stable operation of internal circuits. Meanwhile, some operation tests of a device require confirmation of the operation state of the device which occurs when the internal power supply potential is intentionally changed in a certain range in order to confirm the operation margin of the device. However, in the structure discussed above which converts external power supply potential Ext.Vcc and applies the resultant potential to internal circuits via the internal power supply circuits mentioned above, it is difficult to externally set the potential level generated by the internal power supply circuits at a desired value.

Further, as a screening test before shipment of, for example, the DRAM, an accelerated test which is so-called burn-in test is conducted. The purpose of this test is to reveal potential failures in a memory cell capacitor, a gate insulating film of a transistor, multilayer interconnection and the like by operating the device under accelerated conditions such as high voltage, high environmental temperature and the like. In such an accelerated test, not the potential generated by the internal power supply circuits but any desired power supply potential should be applied to the internal circuits.

Figure 9:
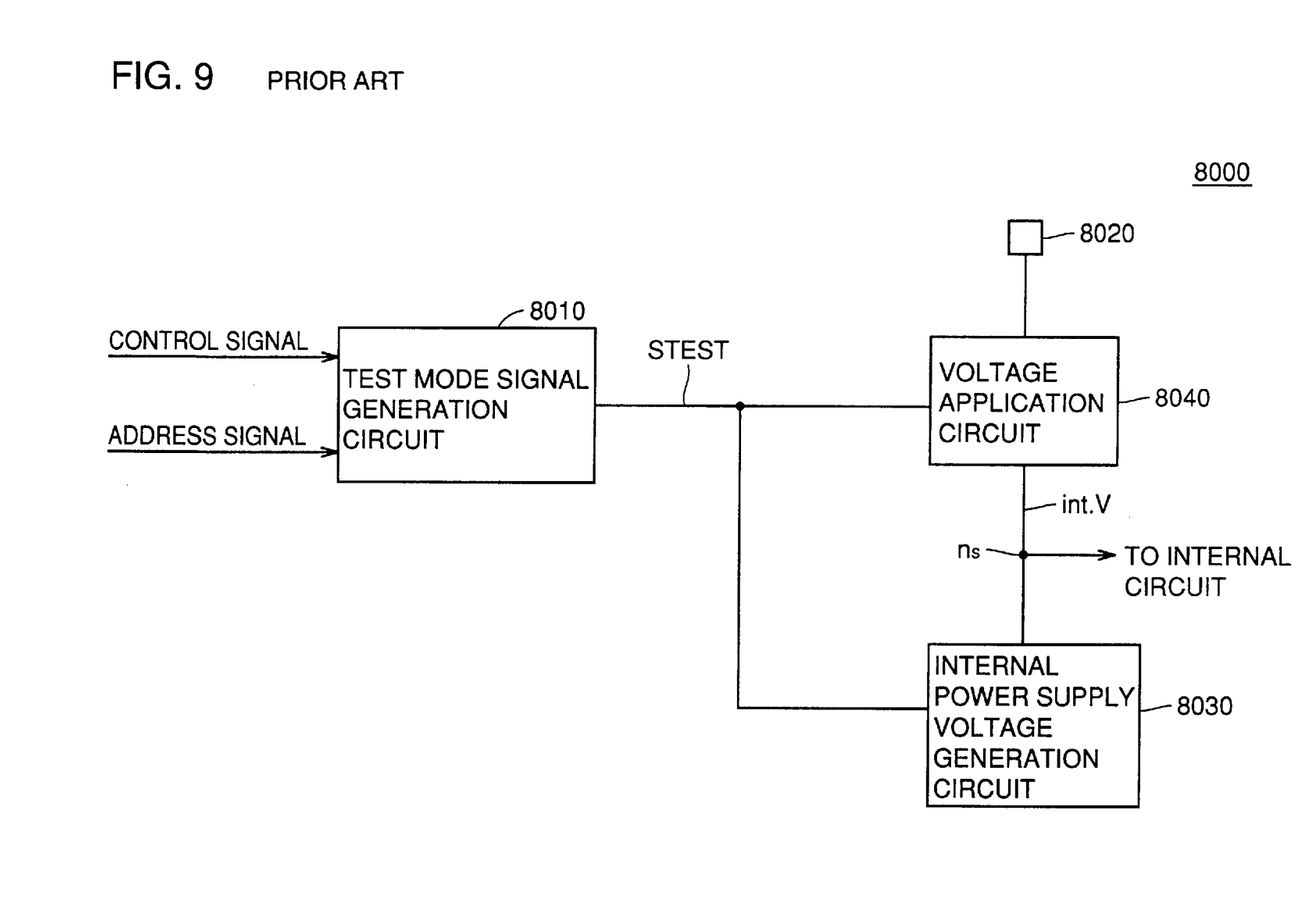
FIG. 9 is a schematic block diagram illustrating a structure of a conventional potential supply circuit 8000.

FIG. 9 is a schematic block diagram illustrating a structure of a conventional potential supply circuit 8000 which enables an externally supplied voltage to be applied to an internal circuit instead of voltage generated by an internal power supply circuit in a semiconductor integrated circuit device.

Referring to FIG. 9, potential supply circuit 8000 includes a test mode signal generation circuit 8010 which generates active test mode signal STEST according to a combination of a control signal and an address signal which are supplied from the outside of the DRAM, a voltage application circuit 8040 which connects an internal power supply node ns to a terminal 8020 receiving an externally applied supply potential in response to activation of test mode signal STEST and electrically disconnects internal power supply node ns from terminal 8020 when the test mode signal is in the inactive period, and an internal power supply voltage generation circuit 8030 which supplies internal power supply voltage int.V to internal power supply node ns when test mode signal STEST is in the inactive period and stops the operation when the test mode signal is in the active period.

Internal power supply voltage generation circuit 8030 in FIG. 9 represents any of the voltage-down power supply circuit, cell plate voltage generation circuit, bit line precharge voltage generation circuit, substrate potential generation circuit and the like.

The level of test mode signal STEST is herein at internal power supply voltage level int.Vcc in the active period and at ground potential level GND in the inactive period.

Figure 10:
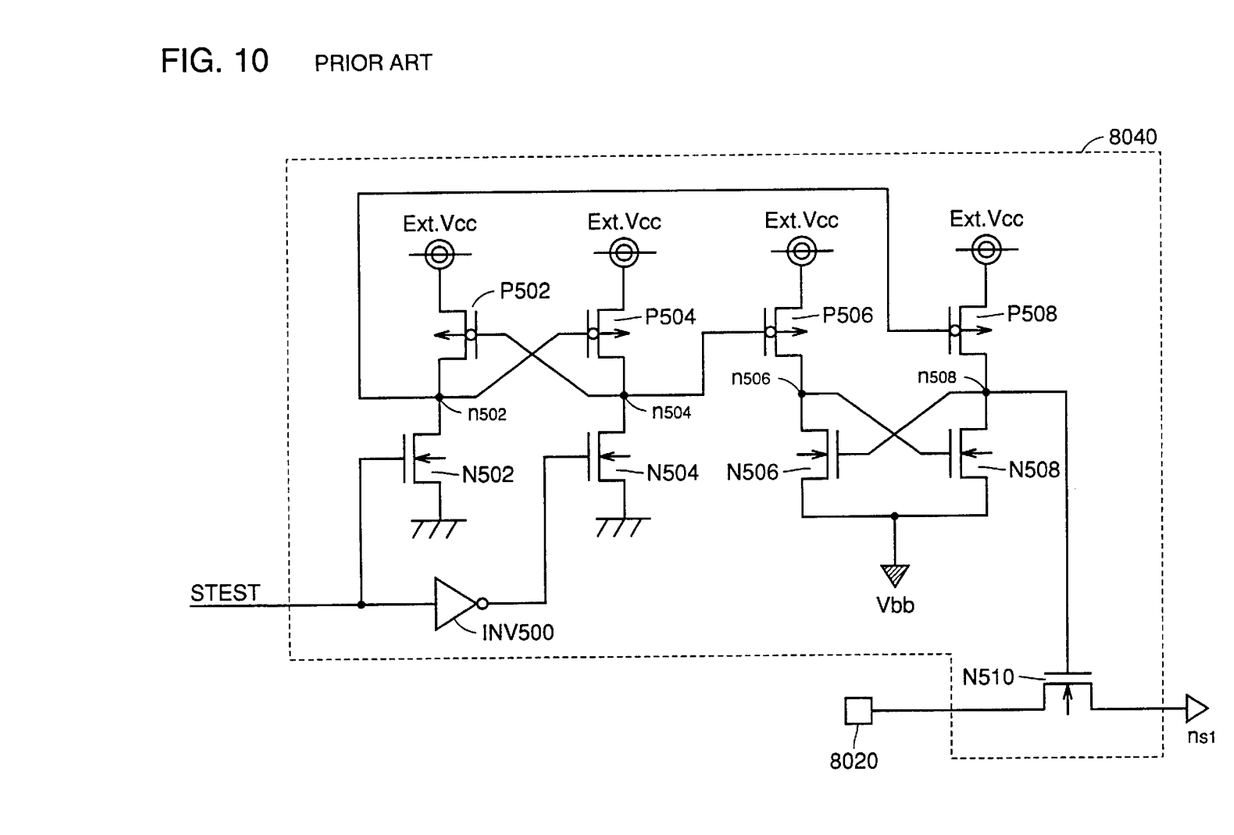
FIG. 10 is a circuit diagram illustrating a structure of a voltage application circuit 8040.

FIG. 10 is a circuit diagram illustrating a structure of voltage application circuit 8040 shown in FIG. 9.

Referring to FIG. 10, voltage application circuit 8040 includes an inverter INV500 operating at internal power supply voltage int.Vcc and receiving test mode signal STEST, a P channel MOS transistor P502 and an N channel MOS transistor N502 connected in series between external power supply voltage Ext.Vcc and ground potential GND, and a P channel MOS transistor P504 and an N channel MOS transistor N504 connected in series between external power supply voltage Ext.Vcc and ground potential GND.

Transistor N502 receives at its gate signal STEST and transistor N504 receives at its gate an output of inverter INV500. Transistor P504 has its gate coupled to a connection node n502 of transistors P502 and N502 and transistor P502 has its gate coupled to a connection node n504 of transistors P504 and N504.

Voltage application circuit 8040 further includes a P channel MOS transistor P506 and an N channel MOS transistor N506 connected in series between external power supply voltage Ext.Vcc and substrate potential Vbb which is a negative potential, and a P channel MOS transistor P508 and an N channel MOS transistor N508 connected in series between external power supply voltage Ext.Vcc and substrate potential Vbb.

The gate of transistor P506 is coupled to node n504 and the gate of transistor P508 is coupled to node n502. The gate of transistor N508 is coupled to a connection node n506 of transistors P506 and N506 and the gate of transistor N506 is coupled to a connection node n508 of transistors P508 and N508.

Voltage application circuit 8040 further includes an N channel MOS transistor N510 coupled between terminal 8020 and internal power supply node ns and having its gate potential controlled by the potential level of node n508.

An operation of voltage application circuit 8040 is now described briefly.

When test mode signal STEST attains an active state ("H" level: internal power supply voltage level int.Vcc), the output of inverter INV500 attains "L" level (ground potential level GND). In response to this, transistor N502 is set into the turn-on state while transistor N504 is set into the turn-off state.

Accordingly, the gate potential of transistor P504 is set at ground potential GND level by transistor N504 and transistor P504 attains the turn-on state. The potential level of node n504 then reaches external power supply voltage Ext.Vcc. On the other hand, transistor P502 remains in the turn-off state. The potential level of node n502 is thus at ground potential GND.

In response to change of the potential of node n504 to external power supply voltage Ext.Vcc, transistor P506 is turned off. In response to change of the potential of node n502 to ground potential GND, transistor P508 is turned on.

In response to change of the potential of node n508 to external power supply voltage Ext.Vcc, transistor N506 is turned on since the gate potential is at external power supply voltage Ext.Vcc. The potential level of node n506 is thus set at substrate potential Vbb of a negative potential. Transistor N508 is accordingly in the turn-off state.

Since the potential of node n508 attains external power supply voltage Ext.Vcc, transistor N510 is turned on to couple terminal 8020 to internal power supply node ns so that potential can be applied from terminal 8020 to internal power supply node ns.

On the other hand, when signal STEST is in an inactive state ("L" level: ground potential level), transistor N504 is turned on and transistor N502 is in turn-off state, so that transistor P502 is turned on and transistor P504 is set into the turn-off state. Accordingly, the level of node n502 attains external power supply voltage Ext.Vcc and the level of node n504 is set at the ground potential level.

This causes transistor P506 to be turned on and the potential of node n506 attains external power supply voltage Ext.Vcc. Accordingly, transistor N508 is turned on so that the potential of node n508, i.e. the gate potential of transistor N510 is set at substrate potential Vbb. Since transistor N510 is turned off, terminal 8020 is electrically disconnected from internal power supply node ns.

In other words, when signal STEST is in the active state, external power supply potential Ext.Vcc is applied to the gate of transistor N510, while substrate potential Vbb is applied thereto when signal STEST is in the inactive state. The external power supply voltage Ext.Vcc is applied to the gate of transistor N510 when test mode signal STEST is active in order to enable voltage of approximately internal power supply potential int.Vcc to be applied externally to internal power supply node ns via terminal 8020.

Substrate potential Vbb is applied to the gate of transistor N510 when test mode signal STEST is inactive so as to prevent undershoot applied to terminal 8020 from being transmitted to internal power supply node ns. However, if the threshold of transistor N510 is Vth and the magnitude of the undershoot is equal to or smaller than potential (Vbb−Vth), transistor N510 is turned on and the undershoot is transmitted to internal power supply node ns. If overshoot is applied to terminal 8020, transistor N510 in the turn-off state can maintain its turn-off state even if the overshoot is applied to terminal 8020 as transistor N510 is an N channel MOS transistor. Thus, the overshoot can be prevented from being applied to internal power supply node ns.

In potential supply circuit 8040 as shown in FIG. 10, when test mode signal STEST is active, voltage (|Ext.Vcc|+|Vbb|) is applied between the source and drain of transistors N508 and P506 and between the gate and source of transistor N506. When test mode signal STEST is inactive, voltage (|Ext.Vcc|+|Vbb|) is applied between the source and drain of transistors N506 and P508 and between the gate and source of transistor N508.

In recent years, the scale-down of semiconductor integrated circuit devices has been accompanied by reduction of the withstand voltage of a gate oxide film or the like. In particular, this problem is serious when a voltage like burn-in which is higher than that in the normal operation is applied to the transistor. It is not accordingly preferable in terms of the reliability that the relatively high voltage (|Ext.Vcc|+|Vbb|) is applied to the transistor.

This also means difficulty in application of a sufficiently high voltage externally to the internal circuits via terminal 8020 because of limitation of the transistor withstand voltage.

SUMMARY OF THE INVENTION

One object of the present invention is to provide a semiconductor integrated circuit device which has a potential supply circuit capable of supplying an arbitrary voltage with a sufficiently large absolute value from the outside of the semiconductor integrated circuit to an internal circuit regardless of output of an internal power supply circuit.

Another object of the present invention is to provide a semiconductor integrated circuit device having a potential supply circuit which externally applies an arbitrary voltage to an internal circuit and capable of preventing transmission of noise of an external pin such as undershoot to the internal circuit.

In general, a semiconductor integrated circuit device according to the present invention includes a control circuit, an internal circuit, an internal power supply circuit and a voltage application circuit.

The control circuit controls the operation of the semiconductor integrated circuit device following an externally supplied instruction. The internal circuit supplies and receives a signal to and from any external unit. The internal power supply circuit receives external power supply potential to generate internal power supply potential to be applied in a normal operation mode for the operation of the internal circuit.

The voltage application circuit is controlled by the control circuit and externally supplies internal power supply potential to the internal circuit instead of an output of the internal power supply circuit in a test operation mode.

The voltage application circuit includes a terminal, a first field effect transistor, a second field effect transistor, and a third field effect transistor.

The terminal receives externally supplied potential. The first field effect transistor is placed between the terminal and an internal node and set into the turn-on state in the test operation mode.

The second field effect transistor is placed between the internal node and an output of the internal power supply circuit, set into the turn-on state in the test operation mode and set into turn-off state in the normal operation mode. The third field effect transistor is located between the terminal and the gate of the first field effect transistor, set into the turn-on state in the normal operation mode and set into the turn-off state in the test operation mode.

Preferably, the internal circuit includes a memory circuit which is controlled by the control circuit and supplies and receives storage data to and from any external unit of the semiconductor integrated circuit device. The memory circuit includes a memory cell array having a plurality of memory cells arranged in rows and columns to hold the storage data, and an input/output circuit which is controlled by the control circuit for data communication between any external unit and a memory cell. The control circuit follows an instruction supplied to the terminal in the normal operation mode so as to issue an instruction to the input/output circuit to perform a data masking operation.

Alternatively, the first, second and third field effect transistors are preferably MOS transistors respectively of a first conductivity type. The voltage application circuit includes a fourth MOS transistor of a second conductivity type, a fifth MOS transistor of the second conductivity type, and a sixth MOS transistor of the second conductivity type. The fourth MOS transistor of the second conductivity type is placed between the terminal and the internal node and set into the turn-on state in the test operation mode. The fifth MOS transistor of the second conductivity type is placed between the internal node and the output of the internal power supply circuit, set into the turn-on state in the test operation mode and turned off in the normal operation mode. The sixth MOS transistor of the second conductivity type is located between the terminal and the gate of the fourth MOS transistor, set into the turn-on state in the normal operation mode and set into turn-off state in the test operation mode.

A principal advantage of the present invention is that application of an arbitrary voltage with a sufficiently large absolute value is possible from the outside of the semiconductor integrated circuit to the internal circuit regardless of the output of the internal power supply circuit. Further, it is possible to avoid transmission of externally supplied noise such as undershoot to the internal circuit.

Another advantage of the invention is that increase of the number of external terminals is unnecessary when the potential is externally supplied and accordingly increase in the chip area can be avoided.

Still another advantage of the invention is that voltage of an arbitrary polarity can be applied from any external unit to the internal circuit and that transmission of externally supplied noise such as the undershoot can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
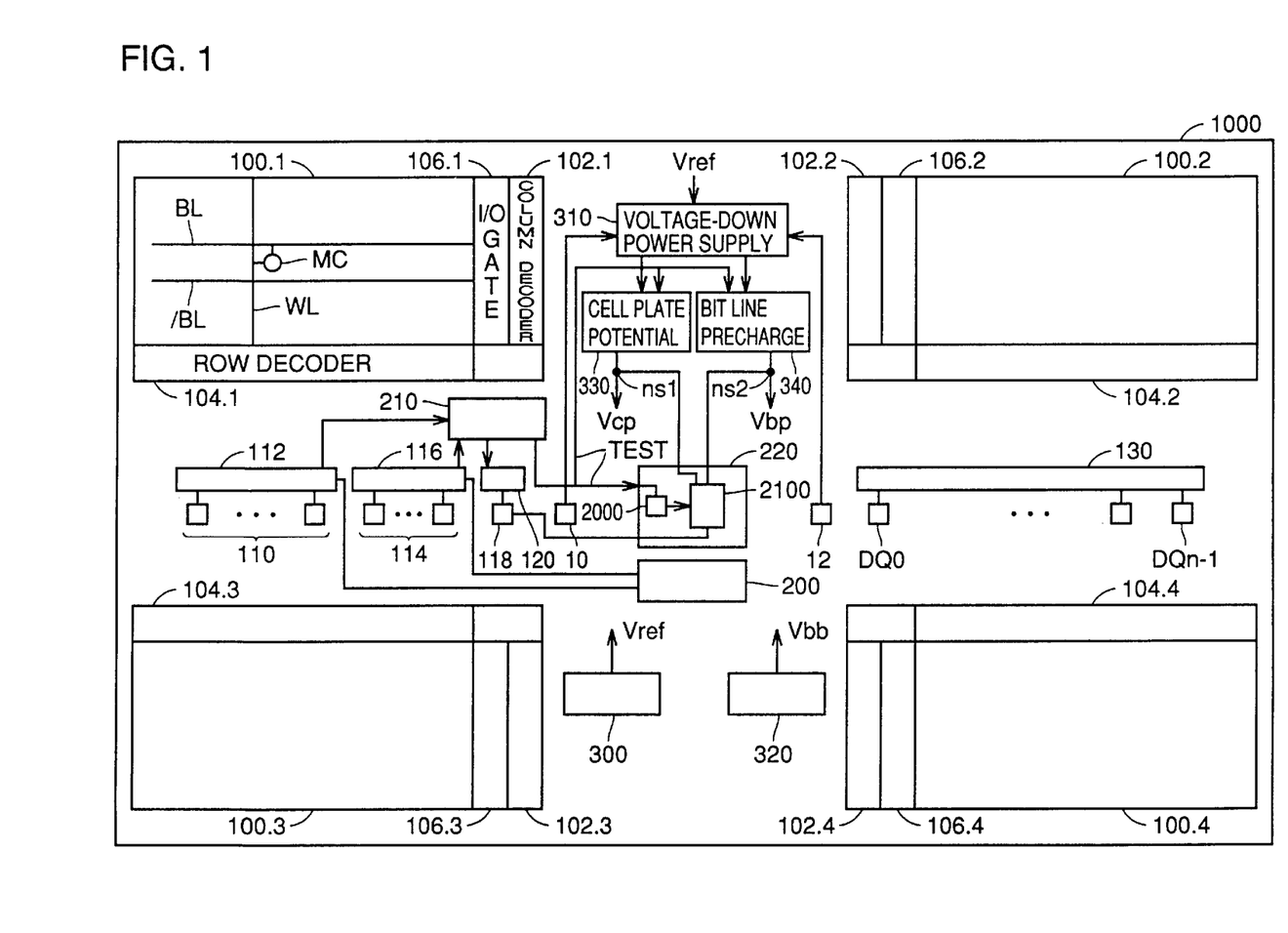
FIG. 1 is a schematic block diagram illustrating a structure of a semiconductor memory device 1000 in a first embodiment of the present invention.

FIG. 1 is a schematic block diagram illustrating a structure of a semiconductor memory device 1000 in the first embodiment of the invention.

Although semiconductor memory device 1000 in FIG. 1 is described as a DRAM, the present invention is not limited to semiconductor memory device 1000 and is more generally applicable to any semiconductor integrated circuit device having an internal power supply circuit as clearly understood by the following discussion.

Referring to FIG. 1, semiconductor memory device 1000 includes a power supply terminal 10 receiving externally supplied external power supply voltage Ext.Vcc, a ground terminal 12 receiving externally supplied ground potential GND, and memory cell array blocks 100.1 to 100.4. Memory cell array blocks 100.1 to 100.4 each include memory cells MC arranged in rows and columns, a plurality of word lines WL arranged in the row direction of the memory cells, and pairs of bit lines BL and /BL arranged in the column direction of the memory cells. FIG. 1 representatively shows one memory cell, an associated word line WL and an associated pair of bit lines BL and /BL in memory cell array block 100.1.

Semiconductor memory device 1000 further includes a group of address signal input terminals 110 for receiving an externally supplied address signal, an address buffer 112 for buffering the address signal, a group of control signal input terminals 114 for receiving an externally supplied control signal, a control signal buffer 116 for buffering the control signal, row decoders 104.1 to 104.4 provided respectively in association with memory cell array blocks 100.1 to 100.4 for selecting a memory cell row (word line) in an associated memory cell array block according to the externally supplied address signal, column decoders 102.1 to 102.4 provided respectively in association with memory cell array blocks 100.1 to 100.4 for selecting a memory cell column (bit line pair) in an associated memory cell array block according to the externally supplied address signal, I/O gates 106.1 to 106.4 provided respectively in association with column decoders 102.1 to 102.4 for communicating data with a selected memory cell, and a control circuit 200 receiving row address strobe signal /RAS, column address strobe signal /CAS, output enable signal /OE, write enable signal /WE which are externally supplied-control signals for controlling the operation of semiconductor memory device 1000.

Semiconductor memory device 1000 further includes a terminal 118 receiving an externally applied potential in a test mode. In a normal operation mode, terminal 118 receives data mask signal DQM for issuing an instruction of a data masking operation to data input from a data input/output terminal, however, this is not a requisite condition. In the normal operation mode, data mask signal DQM is supplied to semiconductor memory device 1000 via a buffer 120, and control circuit 200 controls a data input/output buffer 130 for performing the data masking operation relative to data input/output. If data mask signal DQM is not employed, the test operation mode can share terminal 118, as a terminal receiving an externally applied potential, that receives data mask signal DQM in the normal operation mode with the normal operation mode. In the test operation mode, buffer 120 is stopped from operating.

Such a terminal which can be shared is not limited to the terminal receiving data mask signal DQM and it may be a terminal receiving chip select signal /CS.

In this structure thus configured, it is unnecessary to increase the number of external terminals for receiving externally supplied potentials and accordingly increase in the chip area can be avoided.

Semiconductor memory device 1000 further includes a test mode detection circuit 210 which generates active test mode signal TEST when a test mode is designated by a combination of a control signal and an address signal, a reference potential generation circuit 300 which receives external power supply voltage Ext.Vcc and ground potential GND to generate reference potential Vref, a voltage-down power supply circuit 310 which receives external power supply voltage Ext.Vcc and ground potential GND to generate internal power supply potential int.Vcc based on reference potential Vref, a substrate potential generation circuit 320 which generates substrate potential Vbb lower than ground potential GND, a cell plate potential generation circuit 330 which receives internal power supply potential int.Vcc output from voltage-down power supply circuit 310 to generate cell plate potential Vcp at half of the level of potential int.Vcc, a bit line precharge potential generation circuit 340 which receives internal power supply potential int.Vcc output from voltage-down power supply circuit 310 to generate bit line precharge potential Vbp at half of the level of potential int.Vcc, and a voltage application circuit 220 which receives a potential from terminal 118 to apply the potential to an output node ns1 of cell plate potential generation circuit 330 and an output node ns2 of bit line precharge potential generation circuit 340.

In response to activation of test mode signal TEST, cell plate potential generation circuit 330 and bit line precharge potential generation circuit 340 stop respective operations, and voltage application circuit 220 is activated to supply potential from terminal 118 to nodes ns1 and ns2.

Voltage application circuit 220 includes a voltage application control circuit 2000 which receives test mode signal TEST to generate a voltage application control signal, and a coupling circuit 2100 controlled by the voltage application control signal to couple terminal 118 to power supply nodes ns1 and ns2.

Semiconductor memory device 1000 further includes data input/output terminals DQ0 to DQn−1 and data input/output buffer 130.

Figure 2:
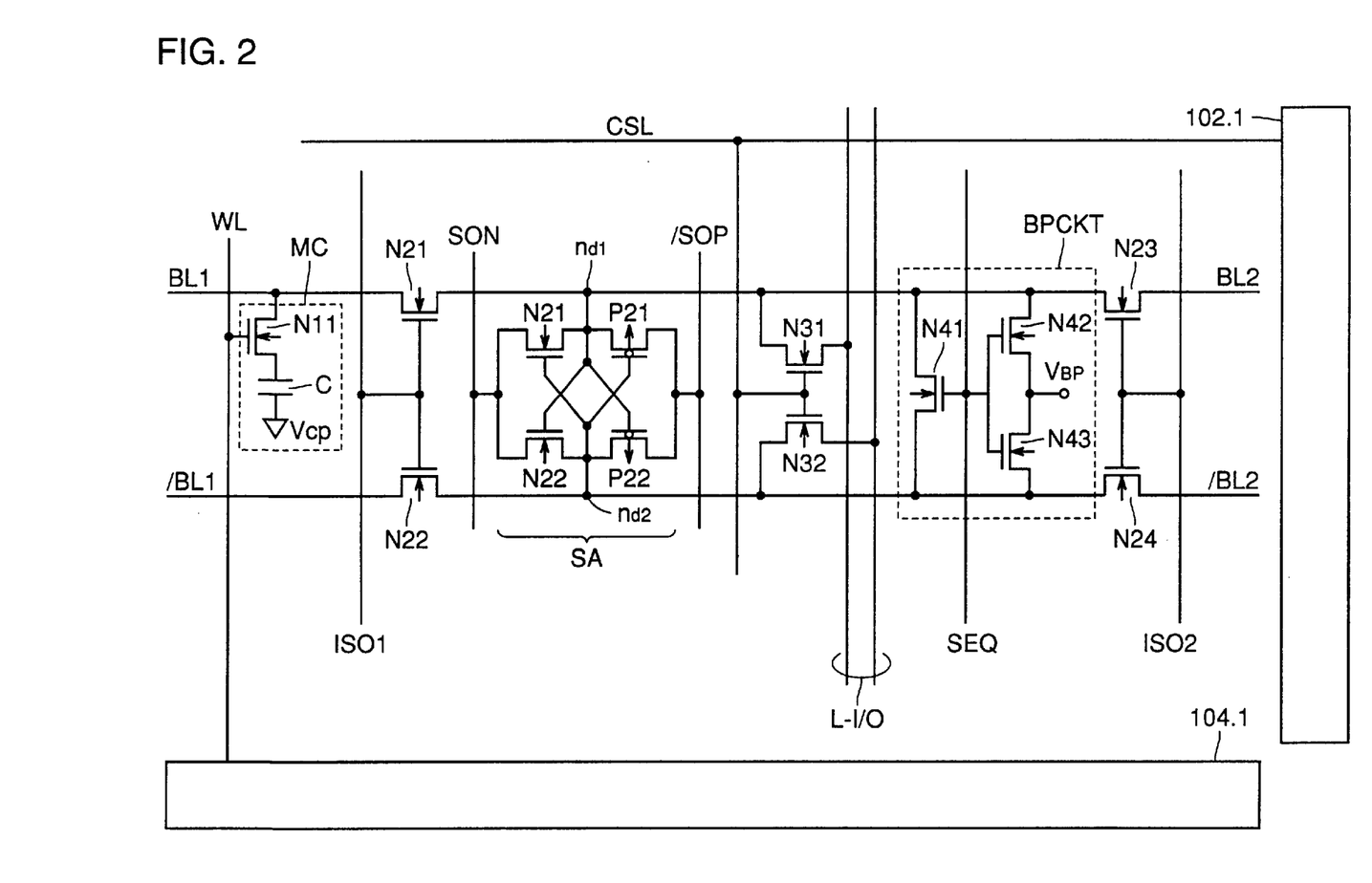
FIG. 2 is a block diagram illustrating in more detail a structure of a memory cell array 100.1 shown in FIG. 1.

FIG. 2 is a block diagram illustrating in more detail the structure of memory cell array 100.1 shown in FIG. 1.

The structure shown in FIG. 2 has the so-called shared sense amplifier configuration in which two pairs of bit lines BL1, /BL1 and BL2, /BL2 share one sense amplifier SA.

Sense amplifier SA is activated under control of sense amplifier control lines SON and /SOP. Sense amplifier SA includes a P channel MOS transistor P21 and an N channel MOS transistor N21 connected in series between sense amplifier control lines /SOP and SON, and a P channel MOS transistor P22 and an N channel MOS transistor N22 connected in series between sense amplifier control lines /SOP and SON.

The gates of transistors P21 and N21 are coupled to a connection node nd2 of transistors P22 and N22, and the gates of transistors P22 and N22 are coupled to a connection node nd1 of transistors P21 and N21.

Connection node nd1 is selectively coupled to bit line BL1 or BL2 via gate transistor N21 controlled by signal SOI1 and a gate transistor N23 controlled by signal SOI2. Connection node nd2 is selectively coupled to bit line /BL1 or /BL2 via gate transistor N22 controlled by signal SOI1 and a gate transistor N24 controlled by signal SOI2.

Memory cell MC includes a memory cell transistor N11, and a memory cell capacitor C having one end coupled to cell plate potential Vcp and the other end coupled to bit line BL1 via memory cell transistor N11. The gate of the memory cell transistor is coupled to word line WL.

A bit line precharge circuit BPCKT includes a transistor N41 controlled by signal SEQ for equalizing the potentials of the pair of bit lines BL1 and /BL1 and the potentials of the pair of bit lines BL2 and /BL2, and transistors N42 and N43 controlled by signal SEQ for transmitting bit line precharge potential Vbp to the paired bit lines BL1 and /BL1 and the paired bit lines BL2 and /BL2.

Data amplified by the sense amplifier is transmitted to a local I/O pair L-I/O via transistors N31 and N32 activated by column selection signal CSL from column decoder 102.1.

Cell plate potential Vcp is supplied to memory cell capacitor C in memory cell MC and bit line precharge potential Vbp is supplied to paired bit lines BL1 and /BL1 and the like as the equalize potential of the bit line pair as described above.

Figure 3:
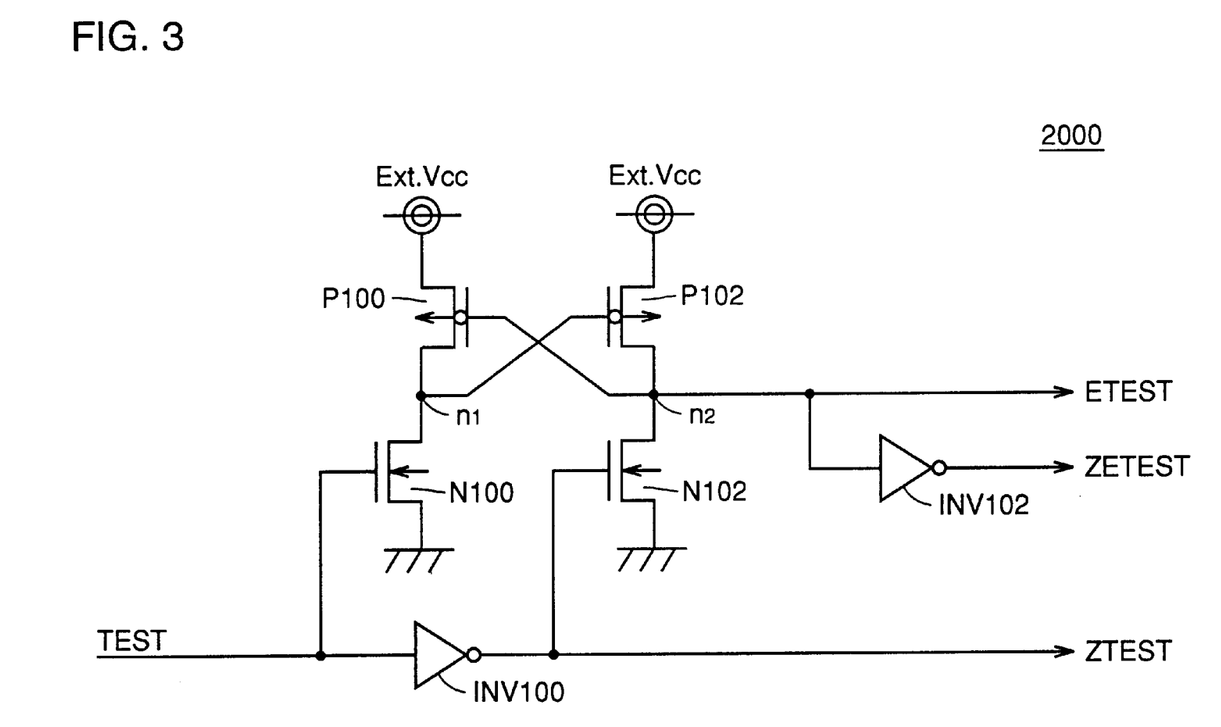
FIG. 3 is a circuit diagram illustrating a structure of a voltage application control circuit 2000 included in a voltage application circuit 220 shown in FIG. 1.

FIG. 3 is a circuit diagram illustrating a structure of voltage application control circuit 2000 included in voltage application circuit 220 in FIG. 1.

Referring to FIG. 3, voltage application control circuit 2000 includes an inverter INV100 operated by ground potential GND and internal power supply potential int.Vcc and receiving test mode signal TEST from test mode detection circuit 210, a P channel MOS transistor P100 and an N channel MOS transistor N100 connected in series between external power supply voltage Ext.Vcc and ground potential GND, and a P channel MOS transistor P102 and an N channel MOS transistor N102 connected in series between external power supply voltage Ext.Vcc and ground potential GND.

The gate of transistor P100 is coupled to a connection node n2 of transistors P102 and N102 and the gate of transistor P102 is coupled to a connection node n1 of transistors P100 and N100. The potential level of node n2 is output as signal ETEST and the output of inverter INV100 is supplied as signal ZTEST.

Voltage application control circuit 2000 further includes an inverter INV102 operated by ground potential GND and external power supply potential Ext.Vcc and receiving the potential of node n2 to output signal ZETEST.

The level of signal ZTEST thus changes between ground potential GND and internal power supply potential int.Vcc, and the levels of signals ETEST and ZETEST change between ground potential GND and external power supply potential Ext.Vcc.

Figure 4:
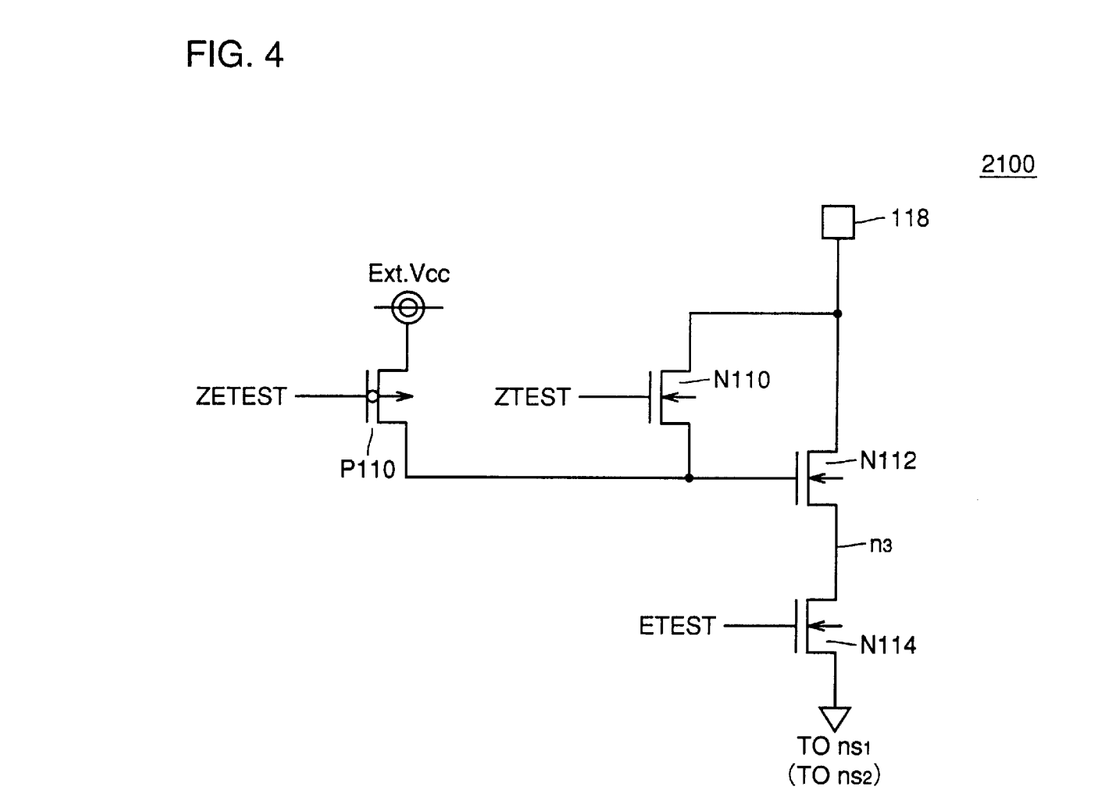
FIG. 4 is a circuit diagram illustrating a structure of a coupling circuit 2100 shown in FIG. 1.

FIG. 4 is a circuit diagram which illustrates a structure of coupling circuit 2100 shown in FIG. 1.

Referring to FIG. 4, coupling circuit 2100 includes N channel MOS transistors N112 and N114 connected in series between terminal 118 and internal power supply nodes ns1 (and ns2), an N channel MOS transistor N110 connected between terminal 118 and the gate of transistor N112 and has its gate potential controlled by signal ZTEST, and a P channel MOS transistor P110 connected between external power supply potential Ext.Vcc and the gate of transistor N112 and has its gate potential controlled by signal ZETEST. The gate potential of transistor N114 associated with internal power supply node ns1 is controlled by signal ETEST.

Transistor N112 prevents undershoot applied to terminal 118 from being transmitted to internal power supply node ns1 (ns2) as clearly understood by the discussion below.

Figure 5:
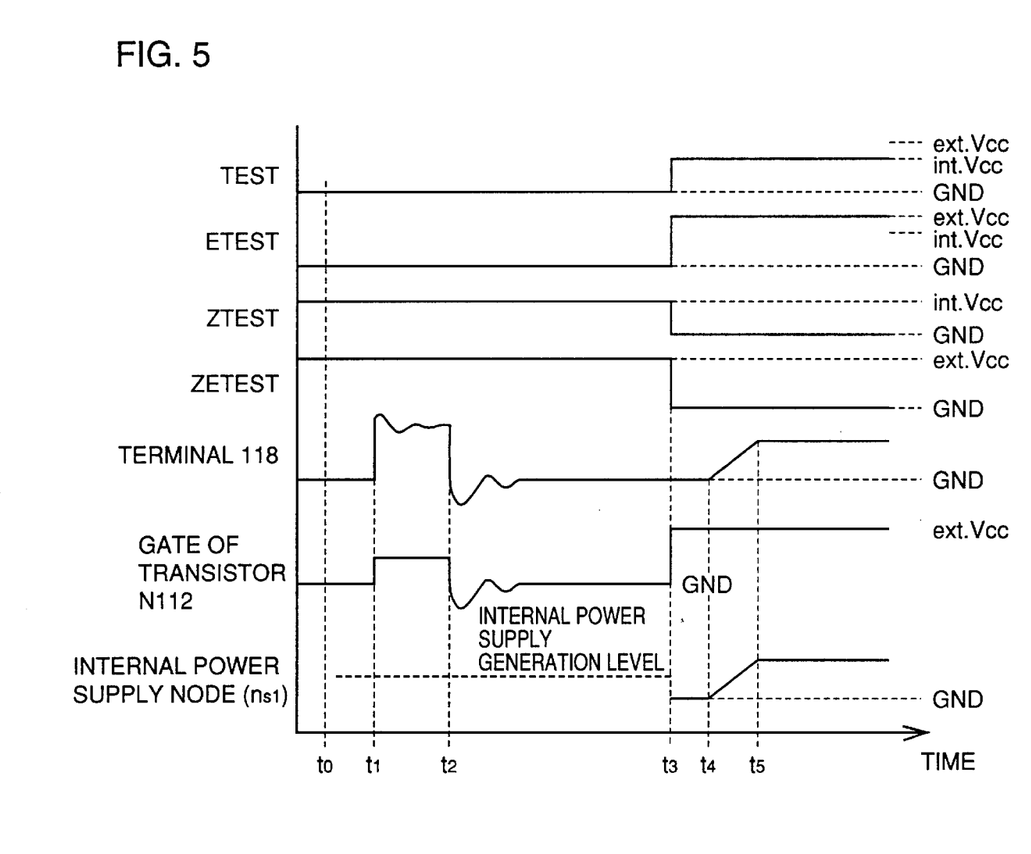
FIG. 5 is a timing chart illustrating operations of voltage application control circuit 2000 and coupling circuit 2100.

FIG. 5 is a timing chart illustrating operations of voltage application control circuit 2000 and coupling circuit 2100 respectively shown in FIGS. 3 and 4.

At time t0, test mode signal TEST is in the inactive state ("L" level) and signals ZETEST, ZTEST and ETEST have respective levels at external power supply potential Ext.Vcc, internal power supply potential int.Vcc and ground potential GND.

Accordingly, transistor N114 is in the turn-off state. On the other hand, transistors N110 and P110 are respectively in the turn-on state and the turn-off state. The potential of terminal 118 is thus applied directly to the gate of transistor N112.

Therefore, when overshoot enters terminal 118 at time t1, the gate potential of transistor N112 accordingly increases and transistor N112 attains the turn-on state. The overshoot is then transmitted to connection node n3 of transistors N112 and N114. However, the overshoot is not transmitted to internal power supply node ns1 (or ns2) since transistor N114 is turned off.

When undershoot enters terminal 118 at time t2, the gate potential of transistor N112 becomes negative so that transistor N112 is turned off. Thus, the undershoot is not transmitted to internal power supply node ns1 (or ns2).

In this way, when the test mode signal is inactive in the normal operation mode, the potentials of cell plate potential generation circuit 330 and bit line precharge potential generation circuit 340 are supplied to internal power supply nodes ns1 and ns2.

Next, when test mode signal TEST attains the active state ("H" level) at time t3, signals ZETEST, ZTEST and ETEST have respective levels at ground potential GND, ground potential GND and external power supply potential Ext.Vcc.

Accordingly, the gate potentials of transistors N112 and N114 are at external power supply potential Ext.Vcc so that transistors N112 and N114 are turned on. On the other hand, transistor N110 is turned off. The potential of terminal 118 is thus applied directly to internal power supply nodes ns1 and ns2 via transistors N112 and N114. If the potential applied to terminal 118 changes in the period between time t4 and time t5, the potential applied to internal supply nodes ns1 and ns2 accordingly change.

In the structure above, such a high voltage (|Ext.Vcc|+ |Vbb|) as found in the conventional art is never applied to any transistor which constitutes voltage application control circuit 2000 and coupling circuit 2100.

Further, it is possible to prevent transmission of the undershoot and overshoot to the internal power supply nodes when the test mode is inactive. When the test mode is active, any desired potential can be supplied to internal circuits as internal power supply potential.

Second Embodiment

Figure 6:
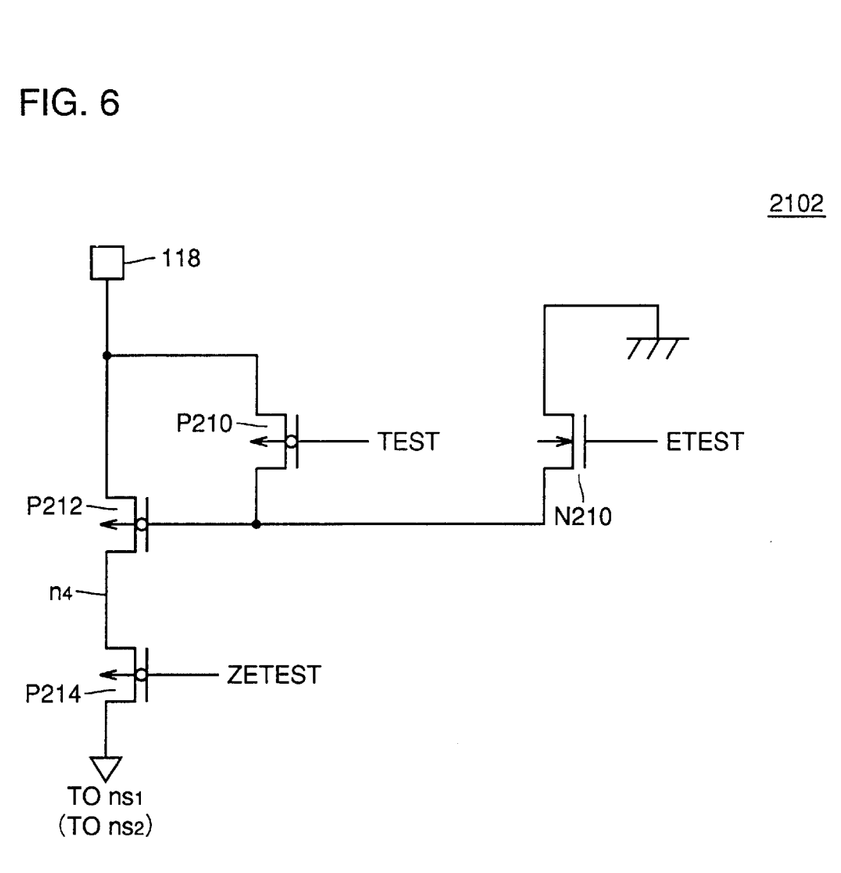
FIG. 6 is a circuit diagram illustrating a structure of a coupling circuit 2102 provided to a semiconductor memory device in a second embodiment of the invention.

FIG. 6 is a circuit diagram illustrating a structure of a coupling circuit 2102 provided in a semiconductor memory device in the second embodiment of the invention.

The structures of components except the coupling circuit of the semiconductor memory device in the second embodiment are similar to those of the semiconductor memory device in the first embodiment and description thereof is not repeated here.

Referring to FIG. 6, coupling circuit 2102 includes P channel MOS transistors P212 and P214 connected in series between terminal 118 and internal power supply nodes ns1 (and ns2), a P channel MOS transistor P210 connected between terminal 118 and the gate of transistor P212 and having its gate potential controlled by signal TEST, and an N channel MOS transistor N210 connected between ground potential GND and the gate of transistor P212 and having its gate potential controlled by signal ETEST. The gate potential of transistor P214 associated with internal power supply node ns1 is controlled by signal ZETEST.

Transistor P212 prevents overshoot applied to terminal 118 from being transmitted to internal power supply node ns1 (ns2) as understood clearly by the description below.

An operation of coupling circuit 2102 is now described briefly.

When test mode signal TEST is in the inactive state ("L" level), the levels of signals ETEST, TEST and ZETEST are respectively at ground potential GND, ground potential GND and external power supply potential Ext.Vcc.

Accordingly, transistor P214 is in the turn-off state. On the other hand, transistors P210 and N210 are respectively in the turn-on and turn-off states. Thus, the potential of terminal 118 is applied to the gate of transistor P212 directly.

If undershoot enters terminal 118, the gate potential of transistor P212 accordingly decreases so that transistor P212 is turned on. Then, the undershoot is transmitted to a connection node ns4 of transistors P212 and P214. However, the undershoot is not transmitted to internal power supply node ns1 (or ns2) since transistor P214 is turned off.

If overshoot enters terminal 118, the gate potential of transistor P212 becomes positive and transistor P212 is turned off. Therefore, the overshoot is not transmitted to internal power supply node ns1 (or ns2).

When the test mode signal is inactive in the normal operation mode, potentials from cell plate potential generation circuit 330 and bit line precharge potential generation circuit 340 are supplied to internal power supply nodes ns1 and ns2.

When test mode signal TEST attains the active state ("H" level), signals ETEST, TEST and ZETEST have respective levels at external power supply potential Ext.Vcc, internal power supply potential int.Vcc and ground potential GND.

The gate potentials of transistors P212 and P214 are accordingly at ground potential GND and transistors N112 and N114 are turned on. On the other hand, transistor P210 is turned off. Then, the potential of terminal 118 is directly applied to internal power supply nodes ns1 and ns2 via transistors P212 and P214. When the potential applied to terminal 118 changes, the potential applied to internal power supply nodes ns1 and ns2 accordingly changes.

In the structure above, such a high voltage (|Ext.Vcc|+ |Vbb|) as found in the conventional art is never applied to any transistor which constitutes voltage application control circuit 2000 and coupling circuit 2102.

In addition, transmission of the undershoot and overshoot to the internal power supply nodes can be prevented when the test mode is inactive. When the test mode is active, any desired potential can be supplied as internal power supply potential from terminal 118 to internal circuits.

Third Embodiment

Figure 7:
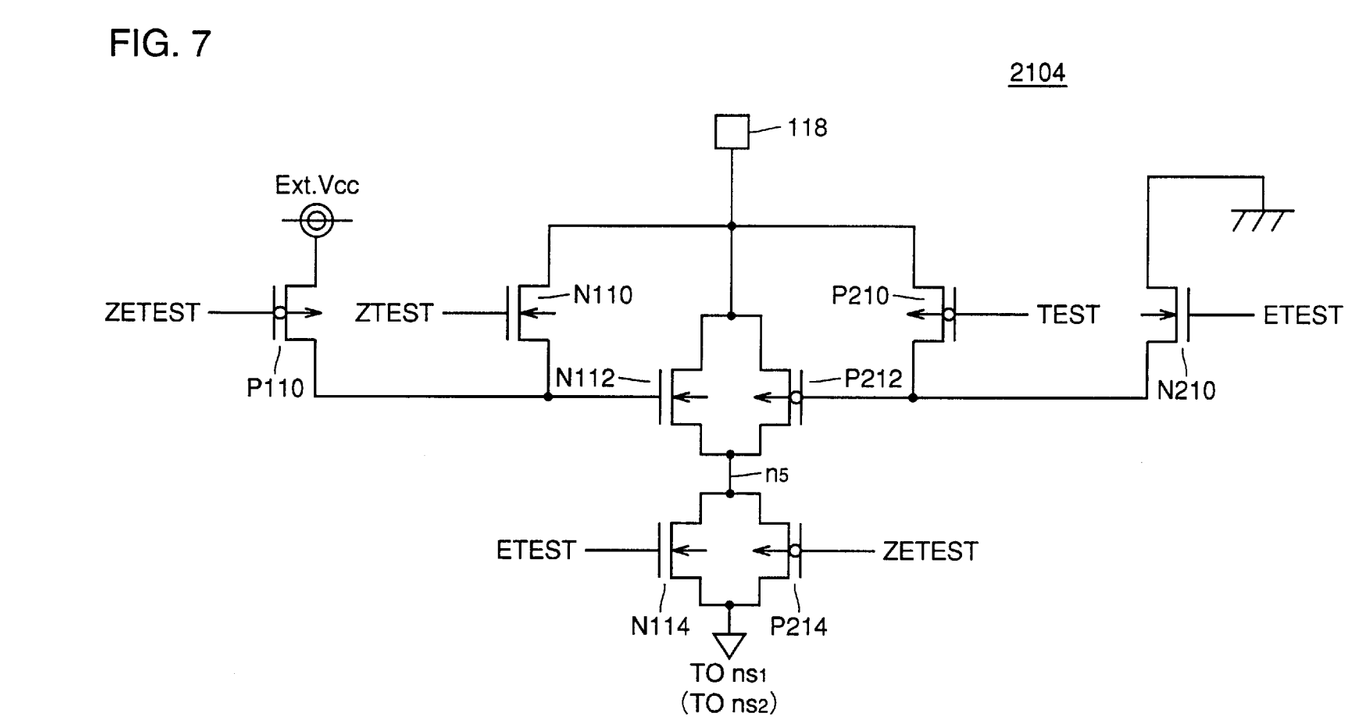
FIG. 7 is a circuit diagram illustrating a structure of a coupling circuit 2104 provided to a semiconductor memory device in a third embodiment of the invention.

FIG. 7 is a circuit diagram illustrating a structure of a coupling circuit 2104 provided in a semiconductor memory device in the third embodiment of the invention.

Those components except the coupling circuit of the semiconductor memory device in the third embodiment are similar to those of the semiconductor memory device in the first embodiment and description thereof is not repeated here.

Referring to FIG. 7, coupling circuit 2104 includes N channel MOS transistors N112 and N114 connected in series between terminal 118 and internal power supply nodes ns1 (and ns2), an N channel MOS transistor N110 connected between terminal 118 and the gate of transistor N112 and having its gate potential controlled by signal ZTEST, and a P channel MOS transistor P110 connected between external power supply potential Ext.Vcc and the gate of transistor N112 and having its gate potential controlled by signal ZTEST. The gate potential of transistor N114 associated with internal power supply node ns1 is controlled by signal ETEST.

Coupling circuit 2104 further includes P channel MOS transistors P212 and P214 connected in series between terminal 118 and internal power supply nodes ns1 (and ns2), a P channel MOS transistor P210 connected between terminal 118 and the gate of transistor P212 and having its gate potential controlled by signal TEST, and an N channel MOS transistor N210 connected between ground potential GND and the gate of transistor P212 and having its gate potential controlled by signal ETEST. The gate potential of transistor P214 associated with internal power supply node ns1 is controlled by signal ZETEST.

Figure 8:
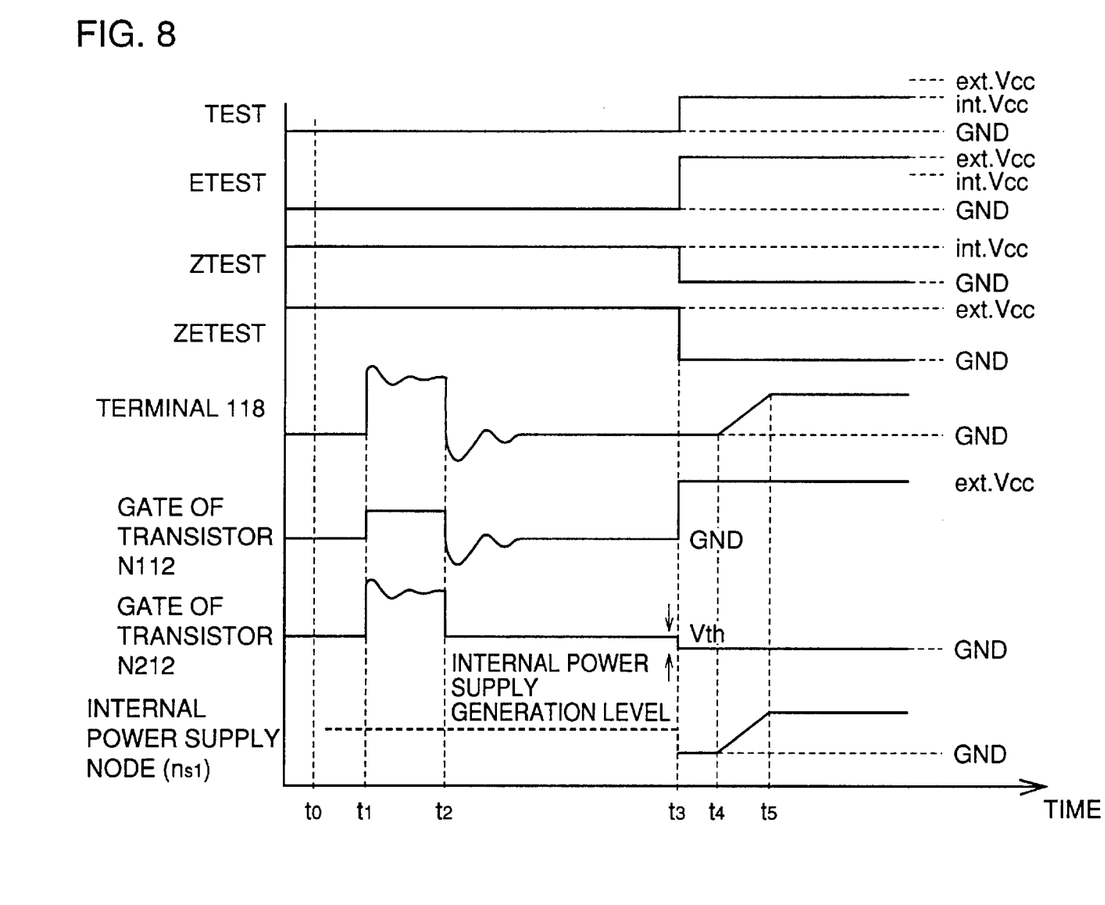
FIG. 8 is a timing chart illustrating operations of voltage application control circuit 2000 and coupling circuit 2104.

FIG. 8 is a timing chart illustrating operations of voltage application control circuit 2000 and coupling circuit 2104 shown in FIGS. 3 and 7 respectively.

At time t0, test mode signal TEST is in the inactive state ("L" level) and signals ZETEST, ZTEST, ETEST and TEST are respectively at external power supply potential Ext.Vcc, internal power supply potential int.Vcc, ground potential GND and ground potential GND.

Transistors N114 and P214 are thus turned off. On the other hand, transistors N110 and P210 are turned on and transistors P110 and N210 are turned off. Then, the potential of terminal 118 is directly applied to the gates of transistors N 112 and P212.

At time t1, if overshoot enters terminal 118, the gate potential of transistor N112 accordingly increases and transistor N112 is turned on. The overshoot is thus transmitted to a connection node n5 of transistors N112 and N114. However, the overshoot is never transmitted to internal power supply node ns1 (or ns2) since transistor N114 is turned off.

If undershoot enters terminal 118 at time t2, the gate potential of transistor P212 accordingly decreases and transistor P212 is turned on. Thus, the undershoot is transmitted to connection node n5 of transistors P212 and P214.

However, the undershoot is never transmitted to internal power supply node ns1 (or ns2) since transistor P214 is turned off.

When the test mode signal is inactive in the normal operation mode, potentials are supplied from cell plate potential generation circuit 330 and bit line precharge potential generation circuit 340 to internal power supply nodes ns1 and ns2.

Next, when test mode signal TEST attains the active state ("H" level) at time t3, levels of signals ZETEST, ZTEST, ETEST and TEST are respectively at ground potential GND, ground potential GND, external power supply potential Ext.Vcc and internal power supply potential int.Vcc.

Accordingly, the gate potentials of transistors N112 and N114 attain external power supply potential Ext.Vcc, and transistors N112 and N114 are turned on. On the other hand, transistor N110 is turned off. Further, the gate potentials of transistors P212 and P214 are at ground potential GND and transistors N112 and N114 are turned on. On the other hand, transistor P210 is turned off. Accordingly, the potential of terminal 118 is directly applied to internal power supply nodes ns1 and ns2 via transistors P212 and P214 and transistors N112 and N114.

When the potential applied to terminal 118 changes in the period from time t4 to time t5, the potentials applied to internal power supply nodes ns1 and ns2 accordingly change. In this case, the potential of terminal 118 is applied to internal power supply node ns1 or ns2 via both of P channel MOS transistors and N channel MOS transistors. Therefore, an arbitrary potential can be supplied to the internal power supply nodes without influence of the voltage drop corresponding to the threshold voltage of the transistor.

In the structure above, such a high voltage (|Ext.Vcc|+ |Vbb|) as found in the conventional art is never applied to any transistor which constitutes voltage application control circuit 2000 and coupling circuit 2104.

In addition, it is possible to avoid transmission of the undershoot and overshoot to the internal power supply nodes when the test mode is inactive. When the test mode is active, a potential at a desired and arbitrary level can be supplied as internal power supply potential from terminal 118 to internal circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a control circuit controlling an operation of said semiconductor integrated circuit device following an externally supplied instruction;
   an internal circuit capable of being in communication by signal with the outside of said internal circuit;
   an internal power supply circuit receiving an external power supply potential to generate an internal power supply potential to drive said internal circuit in a normal operation mode; and
   a voltage application circuit controlled by said control circuit to provide an externally supplied potential to said internal circuit instead of said internal power supply potential in a test operation mode,
   said voltage application circuit including:
   a terminal receiving said externally supplied potential;

a first field effect transistor provided between said terminal and an internal node and set into a turn-on state in said test operation mode;

a second field effect transistor provided between said internal node and output of said internal power supply circuit, set into the turn-on state in said test operation mode and set into a turn-off state in said normal operation mode; and a third field effect transistor provided between said terminal and gate of said first field effect transistor, set into the turn-on state in said normal operation mode and set into the turn-off state in said test operation mode.

2. The semiconductor integrated circuit device according to claim 1, wherein said first, second and third field effect transistors are MOS transistors respectively.

3. The semiconductor integrated circuit device according to claim 1, wherein said internal circuit includes a memory circuit controlled by said control circuit to supply and receive storage data to and from the outside of said memory circuit, said memory circuit includes:

a memory cell array having a plurality of memory cells arranged in rows and columns for holding said storage data; and an input/output circuit controlled by said control circuit to communicate data between any external unit and said memory cells, and said control circuit issues an instruction to perform a data masking operation to said input/output circuit following an instruction supplied to said terminal in the normal operation mode.

4. The semiconductor integrated circuit device according to claim 1, wherein said first, second and third field effect transistors are N channel MOS transistors respectively.

5. The semiconductor integrated circuit device according to claim 4, further comprising means for applying to gates of said first and second MOS transistors in said test operation mode a potential of a higher level than a level output by said internal power supply circuit in the normal operation mode so as to set said first and second MOS transistors into turn-on states.

6. The semiconductor integrated circuit device according to claim 5, wherein said internal circuit includes a memory circuit controlled by said control circuit to supply and receive storage data to and from the outside of said memory circuit, said memory circuit includes:

a memory cell array having a plurality of memory cells arranged in rows and columns for holding said storage data; and an input/output circuit controlled by said control circuit to communicate data between any external unit and said memory cells, and said control circuit issues an instruction to perform a data masking operation to said input/output circuit following an instruction supplied to said terminal in the normal operation mode.

7. The semiconductor integrated circuit device according to claim 1, wherein said first, second and third field effect transistors are P channel MOS transistors respectively.

8. The semiconductor integrated circuit device according to claim 7, wherein said internal circuit includes a memory circuit controlled by said control circuit to supply and receive storage data to and from the outside of said memory circuit, said memory circuit includes:

a memory cell array having a plurality of memory cells arranged in rows and columns for holding said storage data; and an input/output circuit controlled by said control circuit to communicate data between any external unit and said memory cells, and said control circuit issues an instruction to perform a data masking operation to said input/output circuit following an instruction supplied to said terminal in the normal operation mode.

9. The semiconductor integrated circuit device according to claim 1, wherein said first, second and third field effect transistors are respectively MOS transistors of a first conductivity type, said voltage application circuit includes:

a fourth MOS transistor of a second conductivity type provided between said terminal and said internal node and set into the turn-on state in said test operation mode;

a fifth MOS transistor of the second conductivity type provided between said internal node and output of said internal power supply circuit, set into the turn-on state in said test operation mode and set into the turn-off state in said normal operation mode; and a sixth MOS transistor of the second conductivity type provided between said terminal and gate of said fourth MOS transistor, set into the turn-on state in said normal operation mode and set into the turn-off state in said test operation mode.

10. The semiconductor integrated circuit device according to claim 9, wherein said internal circuit includes a memory circuit controlled by said control circuit to supply and receive storage data to and from the outside of said memory circuit, said memory circuit includes:

a memory cell array having a plurality of memory cells arranged in rows and columns for holding said storage data; and an input/output circuit controlled by said control circuit to communicate data between any external unit and said memory cells, and said control circuit issues an instruction to perform a data masking operation to said input/output circuit following an instruction supplied to said terminal in the normal operation mode.

* * * * *